United States Patent
Cumming et al.

(10) Patent No.: US 7,583,106 B2
(45) Date of Patent: Sep. 1, 2009

(54) CLOCK CIRCUITRY

(75) Inventors: Pete Cumming, Wickwar (GB); Jon Mangnall, Clapton-in-Gordano (GB); Graham Cunningham, Redland (GB)

(73) Assignee: Icera, Inc., Wilmington, MA (US)

( * ) Notice: Subject to any disclaimer, the term of this patent is extended or adjusted under 35 U.S.C. 154(b) by 25 days.

(21) Appl. No.: 11/957,352

(22) Filed: Dec. 14, 2007

(65) Prior Publication Data

US 2009/0153194 A1  Jun. 18, 2009

(51) Int. Cl.
  *H03K 19/00* (2006.01)
  *H03K 19/096* (2006.01)

(52) U.S. Cl. .................. 326/93; 327/333; 713/400; 713/401

(58) Field of Classification Search ............ 327/333; 713/322, 400–401, 500–503, 600–601; 326/93
See application file for complete search history.

(56) References Cited

U.S. PATENT DOCUMENTS

| 6,081,904 | A  | * | 6/2000 | Chencinski et al. | ......... 713/400 |
| 6,208,183 | B1 | * | 3/2001 | Li et al. | ............ 327/161 |
| 6,342,796 | B2 | * | 1/2002 | Jung | ............ 327/141 |
| 2003/0107417 | A1 | * | 6/2003 | Roberts et al. | ............ 327/144 |

\* cited by examiner

*Primary Examiner*—Vibol Tan
*Assistant Examiner*—Jason Crawford
(74) *Attorney, Agent, or Firm*—McDermott Will & Emery LLP

(57) ABSTRACT

A circuit comprising: clock circuitry for supplying a first faster clock signal to a first circuit portion and a second slower clock signal to a second circuit portion, and varying the relative frequency of the first and second clock signals. Synchronisation logic generates pulses which indicate when to transfer data between the first and second circuit portions. The clock circuitry generates a first control signal at a predetermined time in each cycle of the first clock signal prior to a predetermined edge, and a second control signal at a predetermined time in each cycle of the second clock signal prior to a predetermined edge. A change in the relative frequency is conditional on a coincidence of the first and second control signals. The synchronisation generates the pulses such that there is at least one cycle of the first clock signal between those pulses, and such that there is only one of those pulses per cycle of the second clock signal.

40 Claims, 11 Drawing Sheets

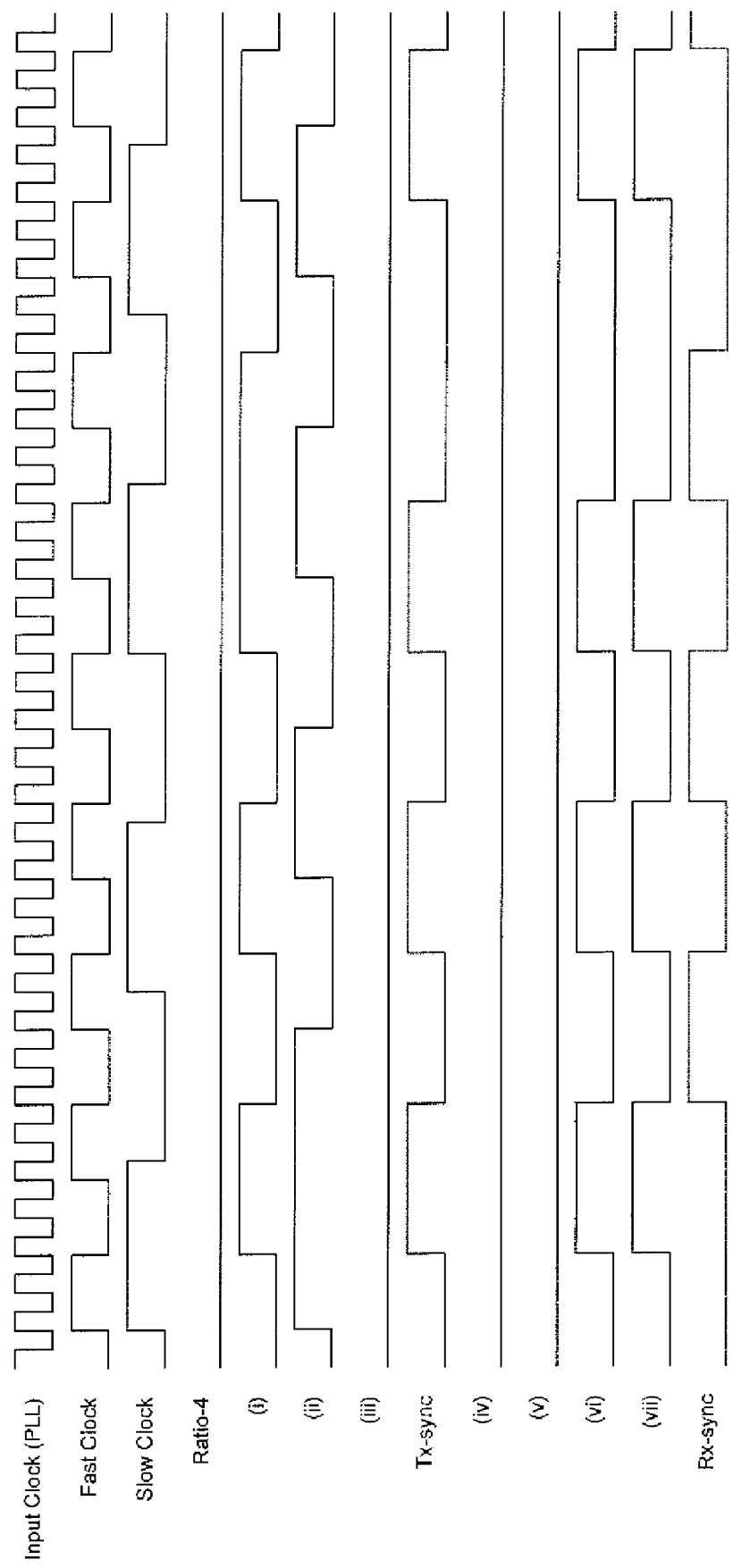

CLOCK CIRCUITRY

FIELD OF THE INVENTION

The present invention relates to coordinating the transfer of data between variable clock domains.

BACKGROUND

Different portions of the same overall circuit may be required to operate at different clock speeds, and furthermore one or more of those clock speeds may be variable. Each portion operating at a given clock speed defines a respective clock domain. For example, FIG. 1 shows schematically an integrated circuit comprising a first circuit portion A clocked by a first clock signal clk-A defining a first clock domain A, and a second circuit portion B clocked by a second clock signal clk-B defining a second clock domain B. In this example, the first circuit A is to transfer data to the second circuit portion B, and furthermore the frequency of each of the first and second clock signals clk-A and clk-B is variable.

However, there are two issues with this: firstly, ensuring the data is passed from one clock domain to another in a synchronised manner; and secondly, ensuring that the transfer remains synchronised even when one or both of the clocks changes speed.

There are a number of standard mechanisms for crossing clock-domain boundaries between components of a silicon chip or other circuit. However, whilst these can provide sufficient bandwidth, they suffer from having significant latency due to the need to resolve metastability and for most high-bandwidth schemes to exchange handshake control signals in both directions across the interface. For high frequency systems, special high-gain flip-flops may also be required in order to provide a sufficiently high probability of resolving meta-stability.

Similarly, clock-frequency changes typically require clocks to be stopped whilst the dividers change frequency so that logic is not subject to glitches (which violate timing and cause functional errors). They also may require that traffic across the interface is stopped so that the interface is in a known "safe" state and accesses cannot be lost or corrupted.

It would be advantageous to provide an improved way of passing data between variable clock domains.

SUMMARY

According to one aspect of the present invention, there is provided a circuit comprising: clock circuitry comprising clock generating means arranged to supply a first clock signal having a first faster frequency to a first circuit portion and a second clock signal having a second slower frequency to a second circuit portion, the clock generating means being operable to vary the relative frequency of the first and second clock signals; synchronisation logic arranged to generate pulses based on the first and second clock signals, each pulse indicating when to transfer data between the first circuit portion and the second circuit portion; gating means arranged to produce a gated clock signal by gating the first clock signal, the gating means being open when said pulses are asserted; and transfer means arranged to clock data between the first circuit portion and the second circuit portion when clocked by the gated clock signal; wherein the clock circuitry comprises control logic configured to generate a first control signal at a predetermined time in each cycle of the first clock signal prior to a predetermined edge of the first clock signal, and to generate a second control signal at a predetermined time in each cycle of the second clock signal prior to a predetermined edge of the second clock signal, the clock generating means being configured such that a change in said relative frequency is conditional on a coincidence of the first and second control signals; and the synchronisation logic is configured to generate said pulses such that there is at least one cycle of the first clock signal between said pulses, and such that there is only one of said pulses per cycle of the second clock signal.

This combination of clock circuitry and synchronisation logic advantageously provides low-latency clock domain crossing that safely supports dynamic clock frequency changes without requiring the clocks to stop whilst changes are in progress. Further, this circuit can advantageously be implemented using only a small amount of logic.

According to another aspect of the present invention, there is provided method comprising: supplying a first clock signal having a first faster frequency to a first circuit portion; supplying a second clock signal having a second slower frequency to a second circuit portion; generating a first control signal at a predetermined time in each cycle of the first clock signal prior to a predetermined edge of the first clock signal; generating a second control signal at a predetermined time in each cycle of the second clock signal prior to a predetermined edge of the second clock signal; varying the relative frequency of the first and second clock signals on the condition of detecting a coincidence of the first and second control signals; generating pulses based on the first and second clock signals to indicate when to transfer data between the first circuit portion and the second circuit portion, such that there is at least one cycle of the first clock signal between said pulses, and such that there is only one pulse per cycle of the second clock signal; producing a gated clock signal by gating the first clock signal so as to pass it when said pulses are asserted; and transferring data between the first circuit portion and the second circuit portion, the transfer being clocked by the gated clock signal.

According to another aspect of the present invention, there is provided a circuit comprising: clock circuitry comprising clock generating means arranged to supply a first clock signal having a first faster frequency to a first circuit portion and a second clock signal having a second slower frequency to a second circuit portion, the clock generating means being operable to select between a plurality of predetermined ratios between the first and second clock frequencies; synchronisation logic for generating pulses based on the first and second clock signals, each pulse indicating when to transfer data between the first circuit portion and the second circuit portion; gating means arranged to produce a gated clock signal by gating the first clock signal, the gating means being open when said pulses are asserted; and transfer means arranged to transfer data between the first circuit portion and the second circuit portion when clocked by the gated clock signal; wherein the synchronisation logic comprises a chain of at least two flip-flops arranged to shift through the second clock signal when clocked by the first clock signal, and combinational logic arranged to generate said pulses in dependence on a combination of outputs from each of said flip-flops; and the combinational logic is arranged to receive a ratio indication signal indicative of the ratio between the first and second frequencies, and to generate said pulses using said ratio indication signal such that regardless of the selected ratio: there is at least one cycle of the first clock signal between said pulses, and there is only one of said pulses per cycle of the second clock signal.

According to another aspect of the present invention, there is provided a method comprising: supplying a first clock signal having a first faster frequency to a first circuit portion;

supplying a second clock signal having a second slower frequency to a second circuit portion; selecting the relative frequency between the first and second clock signals from a plurality of predetermined ratios; shifting the second clock signal through a chain of at least two flip-flops, the shifting being clocked by the first clock signal; receiving a ratio indication signal indicative of the ratio between the first and second frequencies; generating pulses which indicate when to transfer data between the first circuit portion and the second circuit portion, by using a combination of outputs from each of said flip-flops and said ratio indication signal such that, regardless of the selected ratio, there is at least one cycle of the first clock signal between said pulses, and there is only one pulse per cycle of the second clock signal; producing a gated clock signal by gating the first clock signal so as to pass it when the pulses are asserted; and transferring data between the first circuit portion and the second circuit portion, the transfer being clocked by gated clock signal.

For a better understanding of the present invention and to show how it may be carried into effect, reference will now be made by way of example to the accompanying drawings.

BRIEF DESCRIPTION OF THE DRAWINGS

FIG. 9 is another timing diagram of the generation of synchronisation pulses.

DETAILED DESCRIPTION OF PREFERRED EMBODIMENTS

Figure 1:
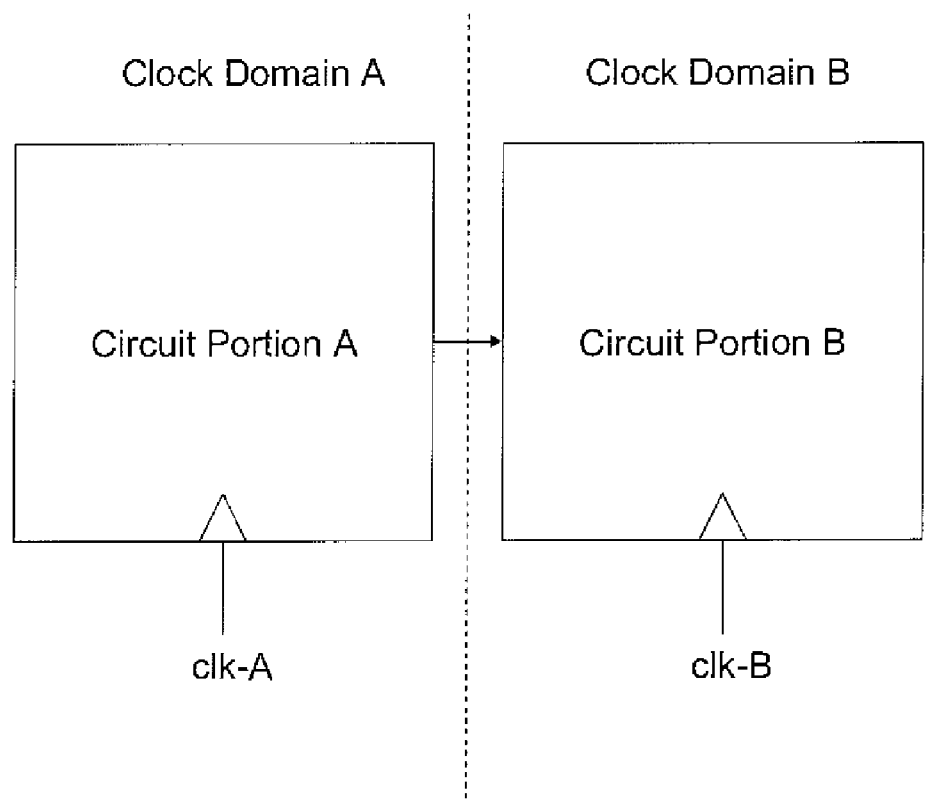
FIG. 1 is a schematic block diagram of two clock domains.
Figure 2:
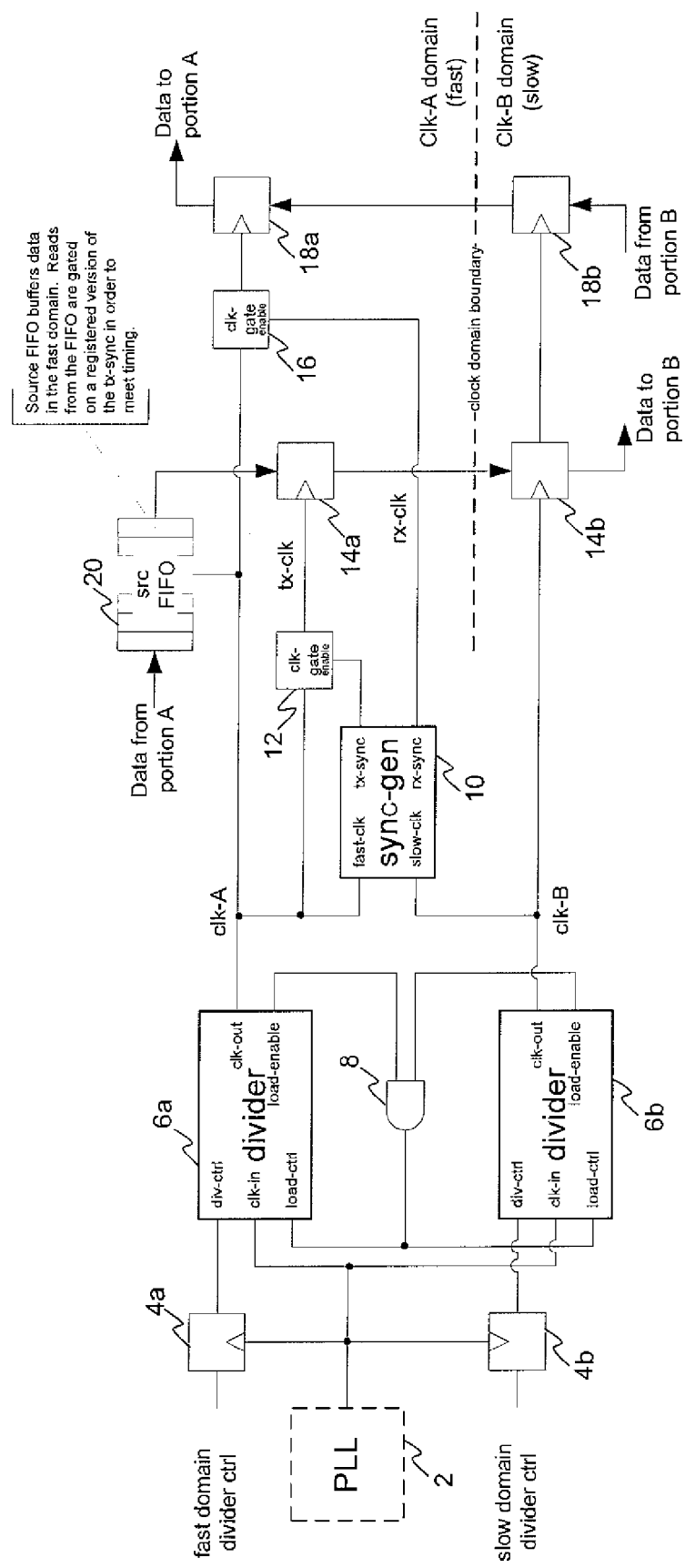
FIG. 2 is a schematic block diagram of a clock gearbox circuit.

FIG. 2 shows circuitry referred to herein as a "clock gearbox". Where a plurality of separate clocks are generated from a single clock source, and there is a requirement to hand-over between the domains, then there is scope to improve upon the problems in the prior art discussed above. In the preferred embodiments, the clock gearbox mechanism provides the following advantages:

- low-latency clock-domain crossing in both directions between fast and slow core clock domains;
- on-the-fly, dynamic clock frequency switching, allowing greater opportunities to save power);
- the clock switching does not require intervention from software (other than to request the change);
- simpler logic and reduced flip-flop count at the crossing;
- the potential to place logic on the path between flops in each clock domain (which is not normally possible due to the risk of capturing logic glitches in the destination domain) subject to normal timing analysis.

The clock gear box consists of two main components (each of which may be instanced multiple times) to provide the advantages above:

- clock dividers 6 that co-ordinate frequency changes to maintain certain properties on the clocks, and
- Synchronisation logic 10 to generate "sync-enables" in the fast domain which signify when it is safe to sample slow-domain data and safe to update data to send to the slow-domain.

Practical systems are also likely to require FIFOs 20 in the fast domain to buffer incoming data to transfer to the slow domain.

The circuitry of FIG. 2 is now described in more detail. In this example, although the frequencies of both clock signals clk-A and clk-B are variable, the frequency of the first clock signal clk-A is always greater (faster) than the frequency of the second clock signal clk-B.

The clock gearbox comprises a first clock divider 6a and a second clock divider 6b. Each divider 6 has a clock input (clk-in), a divider control input (div-ctrl), a load control input (load-ctrl), a clock output (clk-out) and a load enable output (load-enable). The clock gearbox also comprises a first divider control register 4a, a second divider control register 4b, and an AND gate 8.

The clock input (clk-in) of each divider 6a and 6b is connected to receive a source clock signal from a clock source in the form of phase-locked loop (PLL) 2. The clock input of each divider control flip-flop is also connected to receive the source clock signal from the PLL 2. The signal input of the first divider control register 4a is connected to receive a first divider control signal (fast domain divider ctrl) and the signal input of the second divider control register 4b is connected to receive a second divider control signal (slow domain divider ctrl), each of which signals may be generated by software. The output of the first divider control register 4a is connected to the divider control input (div-ctrl) of the first divider 6a and the output of the second divider control register 4b is connected to the divider control input (div-ctrl) of the second divider 6b. The load enable output (load-enable) of each divider 6a and 6b is connected to a respective input of the AND gate 8, and the output of the AND gate 8 is connected to the load control input (load-ctrl) of each divider 6a and 6b.

The clock gearbox further comprises a synchronisation generator 10, a transmit clock gate 12, a receive clock gate 16, a first transmit register 14a, a second transmit register 14b, a first receive register 18a, a second receive register 18b, and a first-in-first-out (FIFO) buffer 20. The synchronisation generator 10 has a first clock input (fast-clk), a second clock input (slow-clk), a transmit synchronisation output (tx-sync) and a receive synchronisation output (rx-sync).

The clock output (clk-out) of the first divider 6a is connected to the first clock input (fast-clk) of the synchronisation generator 10, the clock input of the transmit clock gate 12, the clock input of the receive clock gate 16, a clock input of the FIFO buffer 20, and one or more clock inputs of the first circuit portion A (not shown). The transmit synchronisation output (tx-sync) of the synchronisation generator 10 is connected to the enable input of the transmit clock gate 12, and the receive synchronisation output (rx-sync) of the synchronisation generator 10 is connected to the enable input of the receive clock gate 16. The output of the transmit clock gate 12 is connected to the clock input of the first transmit register 14a, and the output of the receive clock gate 16 is connected to the clock input of the first receive register 18a. The clock output (clk-out) of the second divider 6b is connected to the second clock input (slow-clk) of the synchronisation generator 10, the clock input of the second transmit register 14b, the clock input of the second receive register 18b, and one or more clock inputs of the second circuit portion B (not shown).

The FIFO buffer 20 has an input connected to receive data from the first circuit portion A. The data input of the first transmit register 14a is connected to the output of the FIFO buffer 20. The output of the first transmit register 14a is connected to the data input of the second transmit register 14b. The output of the second transmit register 14b is connected to supply data to the second circuit portion B. The data input of the second receive register 18b is connected to receive data from the second circuit portion B. The output of the second receive register 18b is connected to the data input of the first receive register 18a. The output of the first receive register 18a is connected to supply data to the first circuit portion A.

In operation, the first divider 6a outputs a first clock signal (clk-A) from its respective clock output (clk-out), which it generates by dividing the source clock signal received at its clock input (clk-in) by a first factor. Similarly, the second divider 6b outputs a second clock signal (clk-B) from its respective clock output (clk-out), which it generates by dividing the source clock signal received at its clock input (clk-in) by a second factor.

All the circuitry clocked by the first clock signal clk-A is said to be in the first clock domain. This includes the first circuit portion A, the synchronisation generator 10, the first transmit register 14a, the first receive register 18a, the FIFO buffer 20, and indirectly the transmit clock gate 12 and the receive clock gate 16. All the circuitry clocked by the second clock signal is said to be in the second clock domain. This includes the second circuit portion B, the second transmit register 14b, and the second receive register 18b.

Each of the divider control registers 4a and 4b holds a respective number to control the divide ratio in the dividers 6a and 6b respectively. This number is the preferably the divide ratio (i.e. division factor) itself, but it could be encoded if a different divider architecture is used. The number is preferably multi-bit, but could be a single bit for simpler systems. The first division factor is provided by the first divider control signal (fast domain divider ctrl), which is clocked into the first divider control register 4a using the PLL source clock signal. Similarly, the second division factor is provided by the second divider control signal (slow divider control), which is clocked into the second divider control register 4b using the PLL source clock signal The first divider 6a is arranged to take its respective first division factor from the first divider control register 4a into its divider control input (div-ctrl). Similarly, the second divider 6b is arranged to take its respective second division factor into its divider control input (div-ctrl). Thus the dividers 6a and 6b allow the first and second clock frequencies to be varied.

Each divider 6a and 6b also outputs a respective load enable signal from its respective load enable output (load-enable). These are fed back through the AND gate 8 to the load control inputs (load-ctrl). Each divider is configured to only respond to the value in the respective divider control register to allow a variation in clock frequency on the condition of receiving a signal at its respective load control input (load-ctrl). Thus the AND gate 8 ensures that each divider 6a and 6b can only change clock frequency on the condition that both dividers 6a and 6b output a load enable signal from their respective load enable outputs (load-enable). That is, the frequencies can only change when the load enable signals of the two dividers 6a and 6b are coincident in time. The generation of the load enable signals by the dividers 6a and 6b is discussed later in relation to FIG. 3.

The synchronisation generator 10 produces pulses from the transmit and receive synchronisation outputs (tx-sync and rx-sync) to indicate on which clock cycles of the fast-domain (A) it is safe to send data to the slow domain (B) and to receive data from the slow domain (B) respectively. The generation of these pulses is discussed later in relation to FIGS. 4 to 10b.

The pulses from the synchronisation generator are used to gate the first (faster) clock signal clk-A separately through two branches. So the first transmit clock gate 12 is used to gate the first clock signal clk-A in dependence on the transmit pulses from the transmit synchronisation output (tx-sync) to produce a transmit clock signal (tx-clk), and the receive clock gate 16 is used to separately gate the first clock signal clk-A in dependence on the receive pulses from the receive synchronisation output (rx-sync) to produce a receive clock signal (rx-clk). That is, the transmit and receive clock signals (tx-clk and rx-clk) are gated versions of the first (faster) clock signal clk-A gated in dependence on the transmit and receive pulses from the synchronisation generator 10 respectively.

The transmit clock signal (tx-clk) is used to clock transmitted data from the first circuit portion A into the first transmit register 14a, via the FIFO buffer 20. The transmitted data is then clocked from the first transmit register 14a into the second transmit register 14b in the second (slower) domain B in dependence on the second clock signal clk-B, thus making that data available to the second circuit portion B.

Received data is clocked from the second circuit portion B into the second receive register 18b in dependence on the second clock signal clk-A. The receive clock signal (rx-clk) is then used to clock the received data from the second receive register 18b into the first receive flip-flop 18a in the first (faster) domain, thus making it available to the first circuit portion B.

The transmit and receive registers 14a, 14b, 18a and 18b are preferably each capable of holding a large number of bits for all the data crossing the clock-domain boundary. Preferably, this may be of the order of hundreds of bits in total.

In order to guarantee that the synchronisation pulses (tx-sync and rx-sync) can be successfully generated and that the divider frequencies can be changed without requiring that the data-flows and clocks are stopped, then the dividers 6a and 6b preferably have the following properties.

Frequency changes must only occur when all clocks have coincident rising edges. This allows the synchronisation signals syncs to be generated for widest range of clk-A: clk-B frequency ratios. It also ensures a minimum of two fast cycles per slow cycle is guaranteed when frequencies change.

Clock cycles must never be truncated. This ensures clock glitches can never occur so clocks do not need to be stopped when changing frequency.

Figure 3:
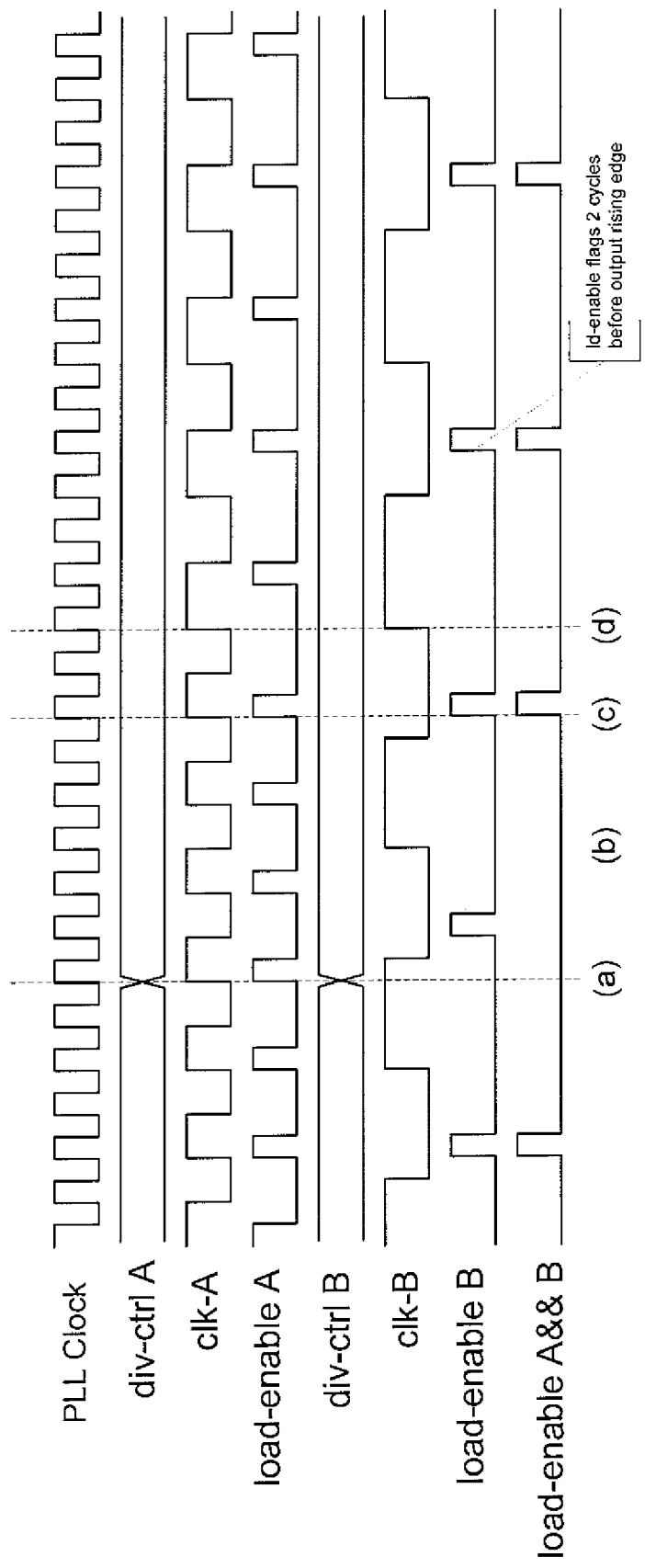
FIG. 3 is a timing diagram showing coordination of frequency dividers.

An example timing diagram showing the coordination of frequency changes using the clock dividers 6a and 6b and AND gate 8 is given in FIG. 3.

As mentioned, the clock dividers 6a and 6b provide clock division from a shared source clock 2. Further to this, they have a load control input (load-ctrl) which blocks updating to a new divide ratio, and a load enable output (load-enable) which signifies when they are about to emit a rising edge on the divided clock (clk-A or clk-B respectively). That is, the load enable output (load-enable) of each divider 6a and 6b generates a signal (in this case signalled by a logic-high) at a predetermined point in time in each cycle prior to a predetermined edge (in this case a rising edge). In this way, the AND of all load-enable outputs (load-enable) can be used to synchronise all relevant clock dividers 6 to update to new frequencies and maintain the relationships described above. So the dividers 6 can only update their divide ratios when both (or more generally all) dividers 6 are about to issue a rising edge, and thus changes in clock frequency are synchronised.

In FIG. 3, at time (a) new divide ratios are presented to dividers. At time (b), the update to new ratios is held off. At time (c), both dividers 6a and 6b flag an impending rising edge and so latch the new controls. At time (d), two pipeline stages later, the new clocks appear at the divider outputs (although note that other divider designs may have different pipeline lengths).

Note also, it is important that the load-enable output (load-enable) generates the load-enable signal at the same number of input PLL clock cycles before an output rising edge as the depth of the divider pipeline.

Turning now to the operation of the synchronisation generator 10, as mentioned this produces the pulses used to select fast-domain cycles on which it is safe to either send data to the slow domain or receive data from the slow domain. In order to ensure that the synchronisation pulses from the synchronisation outputs tx-sync and rx-sync can be successfully generated for the variable clock domains, then the synchronisation pulses are generated according to the following rules.

There is at least one cycle of the first (fast) clock signal between transmit synchronisation pulses (tx-sync), and at least one cycle of the first (fast) clock signal between receive synchronisation pulses (rx-sync).

There is exactly one transmit synchronisation pulse (tx-sync) per cycle of the second (slower) clock signal, and exactly one receive synchronisation pulse (rx-sync) per cycle of the second (slower) clock signal (the slow domain can only consume a single set of data per cycle so there must only be a single tx clock and it only produces a single set of data per cycle so there's no point clocking the rx flops more often since it would just waste power and the fast domain still needs to have an indication of when the rx data has changed to new values).

Figure 4:
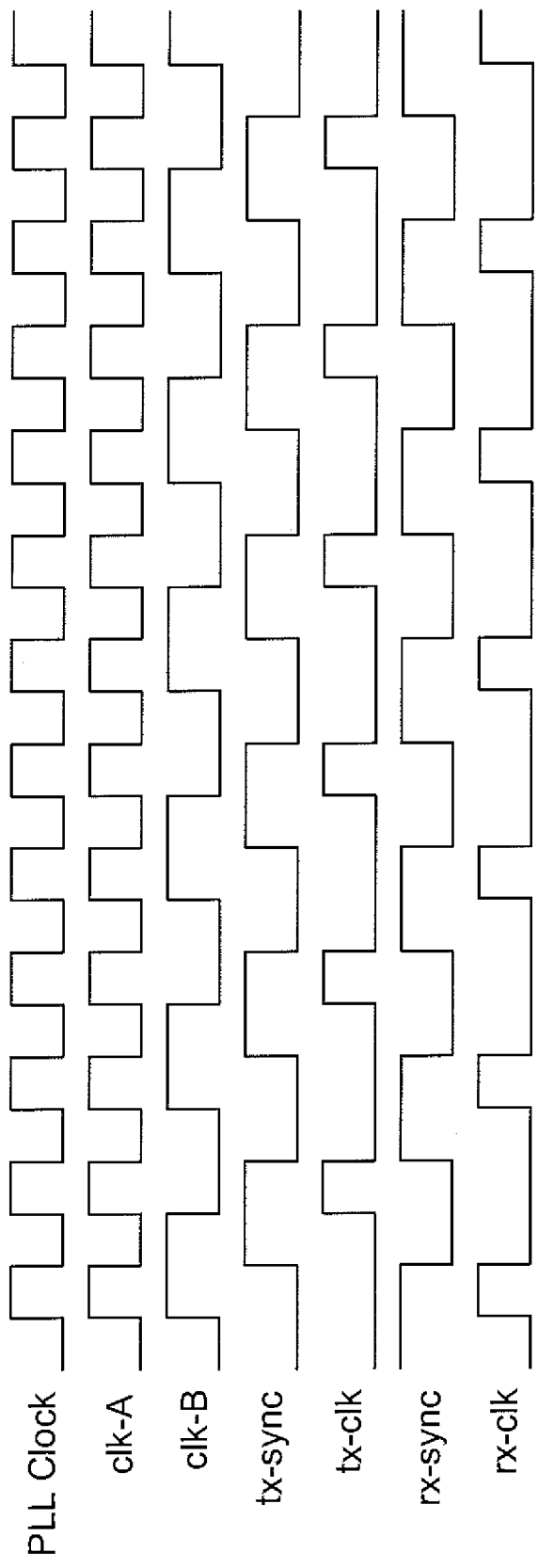
FIG. 4 is a timing diagram showing generation of synchronisation pulses.

An example timing diagram showing the generation of synchronisation pulses according to these rules is given in FIG. 4, in which the ratio of the second clock frequency to the first clock frequency is set to 1:2. Another example of synchronisation pulses according to these rules is given in FIG. 5, in which the ratio of the second clock frequency to the first clock frequency is set to 2:5.

Note also, to maximise utility of the system, ideal synchronisation pulses preferably occur at the beginning and end of each slow clock cycle.

Figure 6:
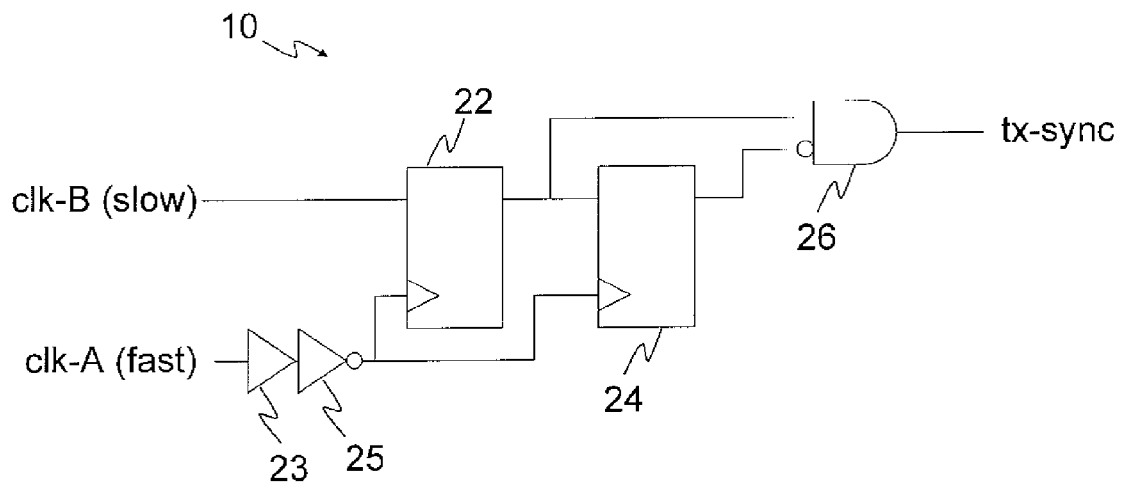
FIG. 6 is a circuit diagram of a transmit synchronisation generator.
Figure 7:
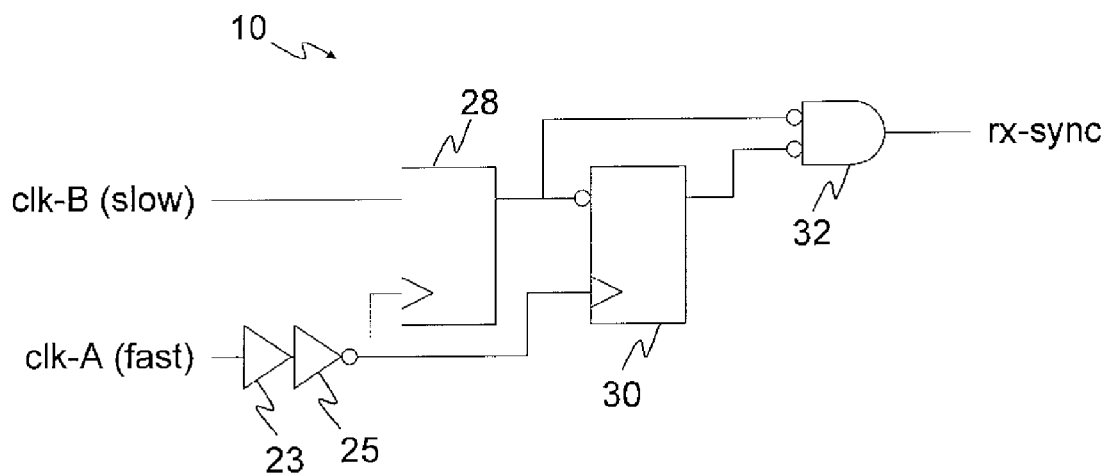
FIG. 7 is a circuit diagram of a receive synchronisation generator.

Generation of synchronisation pulses with real logic cells usually requires some compromises on the set of divide ratios between the fast and slow domains (because with common clock frequencies and realistic gate delays, some of the ratios will violate timing constraints when the logic is laid out). FIGS. 6 and 7 show circuit diagrams which work for all integer and half ratios between fast:slow domains (for example, 1:3, 2:5, 2:6).

FIG. 6 shows synchronisation logic for generating the transmit pulse tx-sync. This comprises a first synchronisation flip-flop 22, a second synchronisation flip-flop 24, and an AND gate 26 with one input inverted. The first and second synchronisation flip-flops 22 and 24 are rising edge triggered flip-flops with an inverter 25 and buffer 23 at the clock input, so are in effect falling edge triggered flip-flops with slightly delayed clock inputs and will be considered as such for the purpose of the following description. The signal input of the first synchronisation flip-flop 22 is connected to receive the second (slower) clock signal clk-B. The signal input of the second synchronisation flip-flop 24 is connected to the output of the first synchronisation flip-flop 22. The output of the first synchronisation flip-flop 22 is connected to the non-inverted input of the AND gate 26. The output of the second synchronisation flip-flop 24 is connected to the inverted input of the AND gate 26. The output of the AND gate 26 is arranged to supply the transmit synchronisation pulses (tx-sync). The buffered and inverted clock inputs of the first and second synchronisation flip-flops 22 and 24 are each connected to receive the first (faster) clock signal clk-A.

Figure 5:
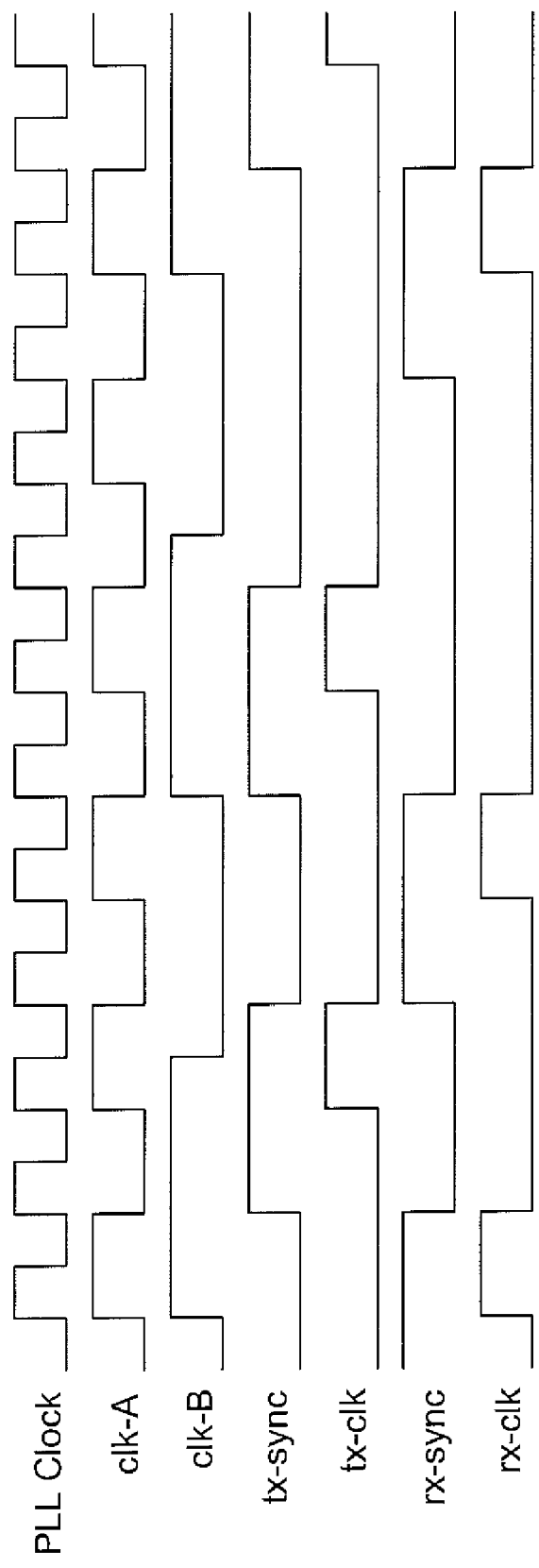
FIG. 5 is another timing diagram showing generation of synchronisation pulses.

In operation, the second (slower) clock signal clk-B is shifted through the first and second synchronisation flip-flops 22 and 24 in dependence on it being clocked by the first (faster) clock signal clk-A. The AND gate 26 generates a transmit synchronisation pulse (tx-sync) whenever the value latched in the first synchronisation flip-flop 22 is logic-one and the value latched in the second synchronisation flip-flop 24 is logic-zero. That is, whenever the slow clock signal clk-B was at a logic-low on the previous falling edge of the fast clock signal clk-A but has changed to a logic-high since the most recent falling edge of the fast clock signal clk-A. This ensures the transmit synchronisation pulse (tx-sync) is generated according to the above rules. Refer also to FIGS. 4 and 5.

FIG. 7 shows synchronisation logic for generating the receive pulse rx-sync. This comprises a third synchronisation flip-flop 28, a fourth synchronisation flip-flop 30 with its signal input inverted, and an AND gate 32 with both inputs inverted (i.e. a NOR gate). The third and fourth synchronisation flip-flops 28 and 30 are again rising edge triggered flip-flops with an inverter 25 and buffer 23 at the clock input, so are in effect falling edge triggered flip-flops with slightly delayed clock inputs and will be considered as such for the purpose of the following description. The signal input of the third synchronisation flip-flop 28 is connected to receive the second (slower) clock signal clk-B. The inverted signal input of the fourth synchronisation flip-flop 30 is connected to the output of the third synchronisation flip-flop 28. The output of the third synchronisation flip-flop 28 is connected to one input of the NOR gate 32. The output of the fourth synchronisation flip-flop 30 is connected to the other input of the NOR gate 32. The output of the NOR gate 32 is arranged to supply the receive synchronisation pulses (rx-sync). The buffered and inverted clock inputs of the third and fourth synchronisation flip-flops 28 and 30 are each connected to receive the first (faster) clock signal clk-A.

In operation, the second (slower) clock signal clk-B is shifted through the third and fourth synchronisation flip-flops 28 and 30 in dependence on being clocked by the first (faster) clock signal clk-A. The second clock signal clk-B is also inverted upon entry into the fourth synchronisation flip-flop 30. The NOR gate 32 generates a receive synchronisation pulse (rx-sync) whenever the value latched in both the third and fourth synchronisation flip-flops 28 and 32 is logic-zero. That is, whenever the slow clock signal clk-B was at a logic-high on the previous falling edge of the fast clock signal clk-A but has changed to a logic-low since the most recent falling edge of the fast clock signal clk-A. This ensures the receive synchronisation pulse (rx-sync) is generated according to the above rules. Again, refer also to FIGS. 4 and 5.

As can be seen from the timings shown in FIG. 5, when a half-integer slow-to-fast clock frequency ratio is set between the dividers 6, then the overall effect of the generator of FIG. 6 is to generate the tx-sync pulses with a gap of one fast clock cycle therebetween except for every alternate pulse where the gap is two clock cycles. Similarly, for a half-integer ratio, the overall effect of the generator of FIG. 7 is to generate the rx-sync pulses with a gap of one fast clock cycle therebetween except for every alternate pulse where the gap is two clock cycles, with the rx-sync pulses being generated out of phase with the tx-sync pulses.

Note how the receive synchronisation pulses (rx-sync) and transmit synchronisation pulses (tx-sync) are generated so as to ensure they are always out of phase, and preferably mutually exclusive in time. Although the link is preferably full duplex with the transmit and receive paths being completely independent, there are still two reasons for generating the receive synchronisation pulses rx-sync out of phase with the transmit synchronisation pulses tx-sync. The first is to ensure that the tx-sync pulse is early in the cycle and the rx-sync is late in the cycle. This allows the greatest possible time from a rising edge of tx-clk to a rising edge of the slow clock clk-B, and from a rising edge of the slow clock cIk-B to a rising edge of rx-clk, which is preferable to cope with the timing of non-ideal logic (see the discussion in relation to FIG. 12 below). The second and perhaps more important reason is that the separation allows a cycle of turn around in the fast domain—i.e. data can be gathered into the fast domain from a given cycle in the slow domain and the response sent in time to catch the following cycle in the slow domain which is as fast as physically possible.

Note also, the reason that the synchronisation flip-flops 22, 24, 28 and 30 are preferably rising edge triggered with an inverter and buffer at the input (rather than simply using falling-edge triggered flip-flops) is because the two clock signals are generated with co-incident edges and in the illustrated embodiments it is necessary to capture changes on the slow clock on the same fast clock edge. That is, it is important that a rising edge on the fast clock captures the fact that a rising or falling edge has coincidentally occurred on the slow clock.

As mentioned, generation of synchronisation pulses with real logic cells usually requires some compromises on the set of divide ratios between the fast and slow domains. This is because with common clock frequencies and realistic gate delays, some of the ratios will violate timing constraints when the logic is actually laid out in silicon. More sophisticated schemes allow a greater range of divide ratios at the expense of more logic. For example, a more sophisticated synchronisation generator 10 is now described in relation to FIG. 8, which supports ratios between the slow and fast clock frequencies including at least 1:2, 1:2.25, 1:2.5, 1:2.75 and all ratios equal to or above 1:3 (i.e. where the frequency of the first clock signal is greater than or equal to three times the frequency of the second).

For generating the transmit synchronisation pulses, this synchronisation generator 10 comprises a first synchronisation flip-flop 38, a second synchronisation flip-flop 44 with its signal input inverted, and a first AND gate 46. The first and second synchronisation flip-flops 38 and 44 are each rising edge triggered flip-flops with an inverter 25 and buffer 23 at the clock input, so are in effect falling edge triggered flip-flops with slightly delayed clock inputs and will be considered as such for the purpose of the following description. The signal input of the first synchronisation flip-flop 38 is connected to receive the second (slower) clock signal clk-B. The signal input of the second synchronisation flip-flop 44 is connected to the output of the first synchronisation flip-flop 38. The outputs of the first and second synchronisation flip-flops 38 and 44 are each connected to a respective input of the first AND gate 46. The output of the first AND gate 46 is arranged to supply the transmit synchronisation pulses (tx-sync). The buffered and inverted clock inputs of the first and second flip-flops 38 and 44 are each connected to receive the first (faster) clock signal clk-A.

To generate the transmit synchronisation pulses (tx-sync), the second (slower) clock signal clk-B is shifted through the first and second synchronisation flip-flops 38 and 44 in dependence on being clocked by the first (faster) clock signal clk-A. The first AND gate 46 generates a transmit synchronisation pulse (tx-sync) whenever the value latched in the first synchronisation flip-flop 38 is logic-one and the value latched in the second synchronisation flip-flop 44 is logic-one. That is, whenever the slow clock signal clk-B was at a logic-low on the previous falling edge of the fast clock signal clk-A but has changed to a logic-high since the most recent falling edge of the fast clock signal clk-A. This ensures the transmit synchronisation pulses (tx-sync) are generated according to the above rules (at least one fast-cycle between transmit pulses and one and only one transmit pulse per slow-cycle).

The timing of the tx-sync pulses is shown in FIG. 9 for a ratio of 1:2.25 (4:9) between the frequency of the second slower clock signal clk-B and the first faster clock signal clk-A. As can be seen, in this case the overall effect of the generator of FIG. 9 is to generate the tx-sync pulses with a gap of one fast clock cycle therebetween except for every third pulse where the gap is two clock cycles.

To deal with a larger set of ratios between the frequency of the first and second clock signals, the synchronisation generator 10 also comprises a comparison block 34 and a ratio indication flip-flop 36. The comparison block is connected to receive a signal indicative of the division ratio of the first (faster) clock divider 6a (fast div ratio) and a signal indicative of the division ratio of the second (slower) clock divider 6b divided by four (slow div ratio/4). The output of the comparison block is connected to the signal input of the ratio indication flip-flop 36. The output of the ratio indication flip-flop 36 is arranged to supply a ratio indication signal. The clock input of the ratio indication flip-flop 36 is connected to receive the PLL source clock signal.

For generating the receive synchronisation pulses, in addition to the comparison block 34 and the ratio indication flip-flop 36, the synchronisation generator 10 further comprises: a third synchronisation flip-flop 40, a fourth synchronisation flip-flop 50, a fifth synchronisation flip-flop 56, a second AND gate 42, a third AND gate 48, a fourth AND gate 54, and an OR gate 52. The third synchronisation flip-flop 40 is a rising edge triggered flip-flop with a buffer 23 at the input. The fourth and fifth synchronisation flip-flops 50 and 56 are also rising edge triggered flip-flops, but have an inverter 25 and buffer 23 at the clock input, so are in effect falling edge triggered flip-flops with slightly delayed clock inputs and will be considered as such for the purpose of the following description. The signal input of the third synchronisation flip-flop is connected to receive the second (slower) clock signal clk-B. The second AND gate 42 is a three-input AND gate with respective inputs connected to the output (i) of the first synchronisation flip-flop 38, the output (ii) of the third synchronisation flip-flop 40, and the output of the ratio indication flip-flop 36. The third AND gate 48 has one input connected to the output (iii) of the second AND gate 42. The output (iv) of the third AND gate 48 is connected to the signal input of the fourth synchronisation flip-flop 50. The output (v) of the fourth synchronisation flip-flop 50 is connected to an input of the OR gate 52. The other input of the OR gate 52 is connected to the output of the second AND gate 46. The output (vi) of the OR gate 52 is connected to the non-inverted input of the fourth AND gate 54 and to the other input of the third AND gate 48. The inverted input of the fourth AND gate 54 is connected to the output of the second AND gate 42. The output (vii) of the fourth AND gate 54 is connected to the signal input of the fifth synchronisation flip-flop 56. The buffered clock input of the third synchronisation flip-flop 40 is connected to receive the first (faster) clock signal clk-A. The buffered and inverted clock inputs of the fourth and fifth synchronisation flip-flops 50 and 56 are also connected to receive the first (faster) clock signal clk-A. The output of the fifth synchronisation flip-flop is arranged to supply the receive synchronisation pulses (rx-sync).

In operation, the comparison block 34 performs a comparison to determine whether or not the division ratio of the first (faster) divider 6a is less than or equal to a quarter of the division ratio of the second (slower) divider 6b. The comparison block 34 outputs a ratio indication signal indicative of the result of this comparison, which is clocked into to the ratio-indication flip-flop 36 in dependence on the PLL clock. So in this case, if the frequency of the first clock signal clk-A is greater than or equal to four times the frequency of the second clock signal clk-B, then the comparison block 34 outputs the ratio-indication signal at a logic-one. If not, it outputs the ratio-indication signal at a logic-zero.

If a logic-zero is held in the ratio indication flip-flop 36, to indicate the first clock frequency is less than four times the second, then the second AND gate 42 will be closed and will always output a logic-zero regardless of the bits held in the first synchronisation flip-flop 38 and third synchronisation flip-flop 40. This means the output of the third AND gate remains logic-zero, and so the input to the OR gate 52 from the third synchronisation flip-flop 50 also remains at logic-zero. Therefore the output of the OR gate 52 is equal to its other input, i.e. the transmit synchronisation pulses (tx-sync). At the same time, the inverted input of the fourth AND gate 54 is always a logic-one, making the fourth AND gate 54 transparent to the output of the OR gate 52. Thus the transmit synchronisation pulses (tx-sync) are provided unchanged to the input of the fifth synchronisation flip-flop 56, which delays them by one cycle of the first (faster) clock clk-A to generates the receive synchronisation pulses (rx-sync).

The timing of the receive pulses (rx-sync) for a slow-to-fast frequency ratio of 4:9 is also shown in FIG. 9. Similarly to the tx-sync pulses, in this case the overall effect of the generator of FIG. 9 is to generate the rx-sync pulses with a gap of one fast clock cycle therebetween except for every third pulse where the gap is two clock cycles. Again, note also that the receive synchronisation pulses (rx-sync) and transmit synchronisation pulses (tx-sync) are ensured to be always out of phase, and preferably mutually exclusive in time.

If on the other hand a logic-one is held in the ratio indication flip-flop 36 to indicate that the frequency of the first clock signal clk-A is greater than or equal to four times the frequency of the second clock signal clk-B, then the receive pulses (rx-sync) are generated as discussed below.

Figure 10A:
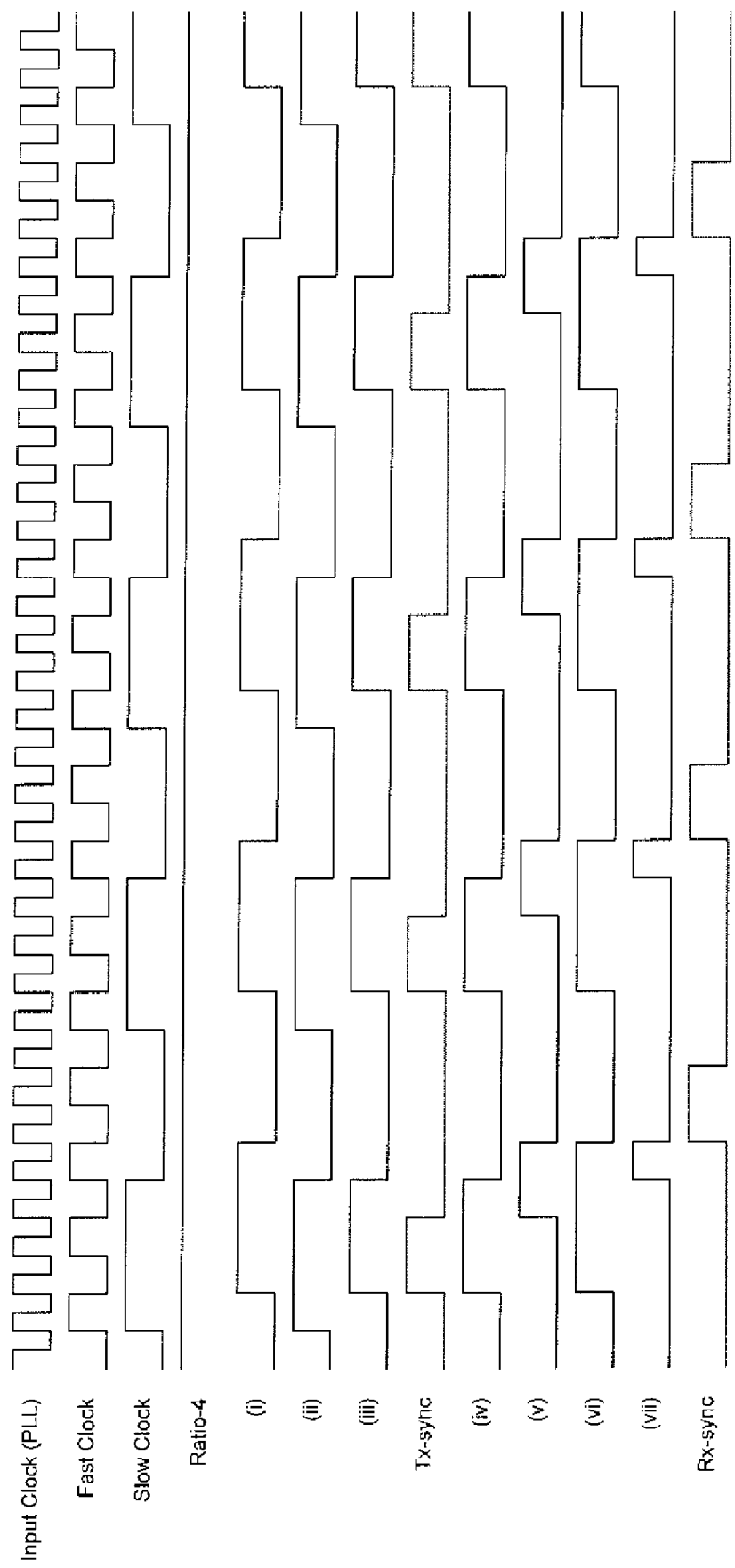
FIG. 10a is another timing diagram of the generation of synchronisation pulses.
Figure 10B:
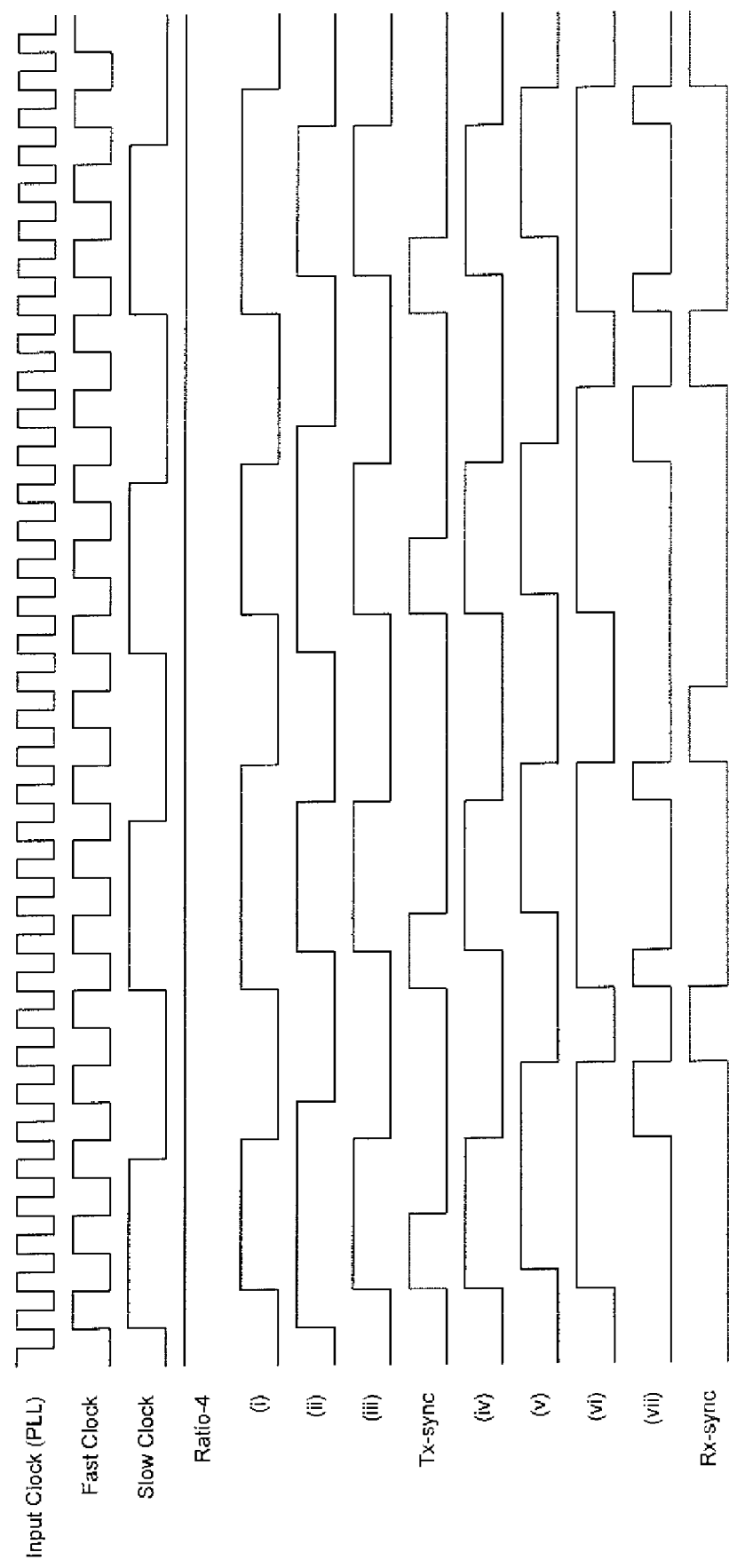
FIG. 10b is another timing diagram of the generation of synchronisation pulses.

The timing diagram of FIG. 10a shows the timing of receive and transmit pulses for an example ratio of 2:8 (1:4) between the frequency of the second slower clock signal clk-B and the first faster clock signal clk-A. The timings of the signals marked (i) to (vii) in FIG. 10 correspond to the signals at the points marked (i) to (vii) respectively in the circuit diagram of FIG. 8. FIG. 10b shows the timing an alternative ratio of 2:9 (1:4.5).

Again, the first AND gate 46 generates a transmit synchronisation pulse (tx-sync) whenever the value latched in the first synchronisation flip-flop 38 is logic-one and the value latched in the second synchronisation flip-flop 44 is logic-one. That is, whenever the slow clock signal clk-B was at a logic-low on the previous falling edge of the fast clock signal clk-A but has changed to a logic-high since the most recent falling edge of the fast clock signal clk-A. This ensures the transmit synchronisation pulses (tx-sync) are generated according to the above rules (at least one fast-cycle between transmit pulses and one and only one transmit pulse per slow-cycle).

As part of generating the receive synchronisation pulses (rx-sync), the second (slower) clock signal clk-B is clocked into the third synchronisation flip-flop 40 in dependence on it being clocked by a rising edge of the first (faster) clock signal clk-A. The second (slower) clock signal clk-B is also clocked into the first synchronisation flip-flop 38 in dependence on it being clocked by a falling edge of the first (faster) clock signal. This results in two signals (i) and (ii) as shown in the examples of FIGS. 10a and 10b.

The third AND gate 48 takes the AND (iv) of this signal (iii) and the output (vi) of the OR gate 52. So (iv) must be low whenever (iii) is low, and must be high at least when both tx-sync and (iii) are high. This high is latched into the fourth synchronisation flip-flop 50 on a falling edge of clk-A. The value (v) in the fourth synchronisation flip-flop 50 remains latched high until the next falling edge of clk-A after (iii) goes low. So (iv) is high for the whole time while (iii) is high, and (v) is the signal (iv) shifted through the fourth synchronisation flip-flop 50 in dependence on being clocked by a falling edge of clk-A as shown in the examples of FIGS. 10a and 10b.

The output (vi) of the OR gate 52 is high whenever either tx-sync or (v) is high. The fourth AND gate 54 takes the AND (vii) of the output (vi) of the OR gate 52 and the opposite value to (iii) from the second AND gate 42. So (vii) is high only when (vi) is high and (iii) is low. The signal (vii) is then clocked into the fifth synchronisation flip-flop 56 in dependence on it being clocked by a falling edge of clk-A. Again these signals are shown in the examples of FIGS. 10a and 10b.

The resulting receive synchronisation pulses (rx-sync) generated at the output of the fifth synchronisation flip-flop 56 are one fast clock cycle long and one fast clock cycle out of phase with the transmit synchronisation pulses (tx-sync). The receive synchronisation pulses (rx-sync) are thus again also ensured to be generated according to the above rules (at least one fast-cycle between transmit pulses and one and only one transmit pulse per slow-cycle) and to be mutually exclusive in time to the transmit synchronisation pulses (tx-sync).

The extra logic in the sync-generator of FIG. 8 can be understood as follows. The simpler sync generation logic of FIGS. 6 and 7 essentially generates the tx-sync by detecting a rising edge on the slow clock and the rx-sync by detecting a falling edge on the slow clock. The problem with this is that for lots of the non-integer or non-half ratios where the ratio of fast:slow division factors is low (i.e. around 1:2 or 1:3) then the rx-sync pushes too late in the cycle causing the rx-clk to occur after the slow clock edge. This means that changing data is caught from the slow domain into the fast domain which hits metastability problems or misses a cycle of data altogether. The tx-sync is always generated as early as possible in the cycle, but cannot physically push back into the previous cycle so does not display similar problems.

Figure 8:
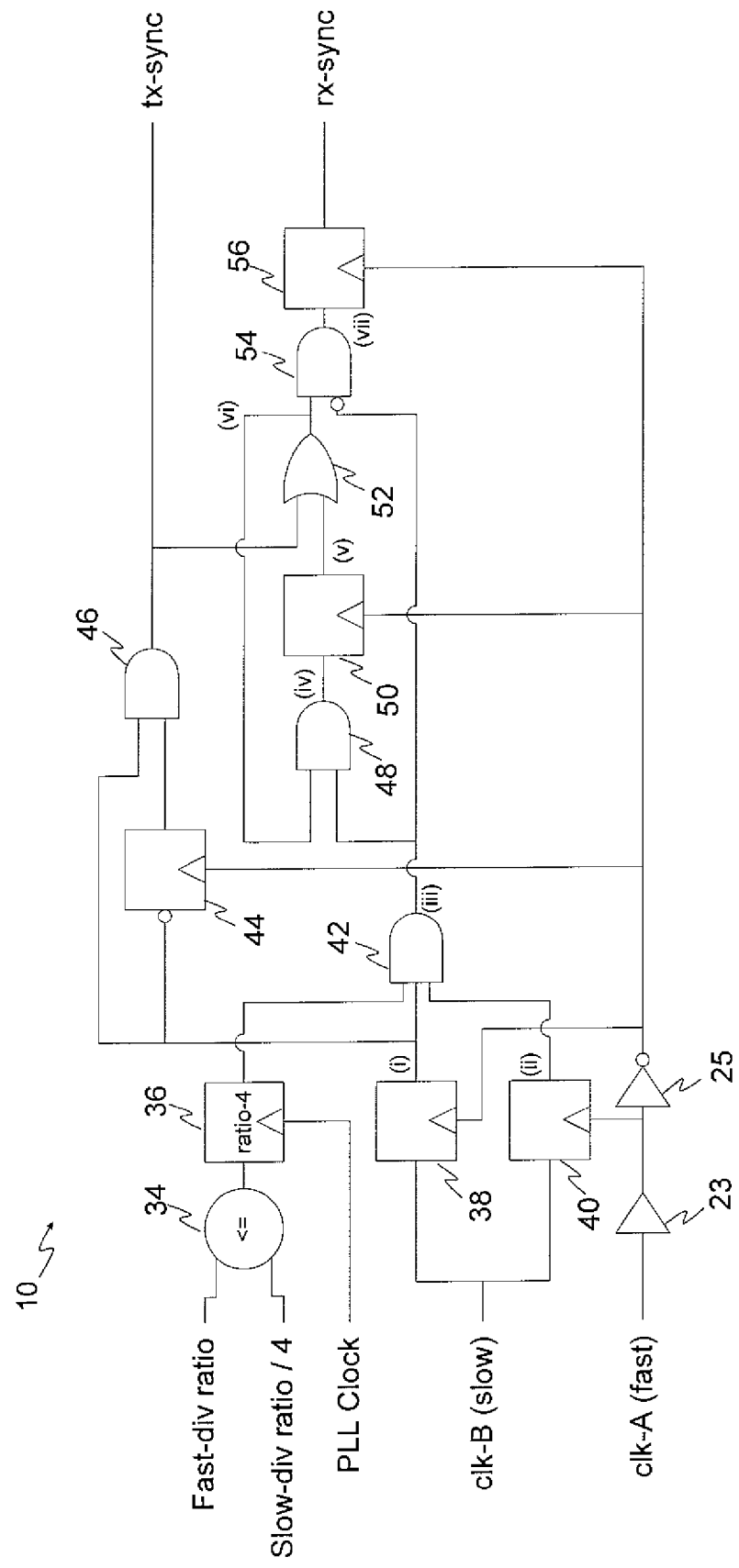
FIG. 8 is a circuit diagram of a transmit and receive synchronisation generator.

The more complicated logic of FIG. 8 solves this by changing the mechanism for generating the rx-sync depending upon the ratio between the fast and slow domains. So, when the ratio of fast:slow division factors is <1:4 the rx-sync is generated directly from the tx-sync by delaying it by a single cycle. This guarantees that the rx-sync can never be too late because it is always guaranteed that the fast:slow ratio is >=1:2 and the rx-sync is always within half a fast cycle (the tx-clk is within a whole cycle) of the beginning of the slow cycle, and it can be toleraterated for the rx-clock to be coincident with the rising edge of the slow clock (but no later). This works alright because the slow domain can never be very fast (e.g. limited to 166 MHz in preferred embodiments) so having the two sync pulses in successive cycles still actually allows quite a lot of time and the logic can build with real (non-ideal) gates.

When the fast domain is running at full speed, so the ratio between the clocks is high (i.e. >=1:4), then two successive cycles are a much shorter time and it is necessary to push the rx-sync later in the slow cycle (ideally, as close to the end as possible but after the falling edge on the slow clock is good enough). This is done by using the ratio-4 control signal to switch back to the same mechanism as the simpler version, which essentially generates the rx-sync from the falling edge of the slow clock. The node marked (iii) in FIG. 8 can be thought of as a hold-off signal to delay the rx-sync pulse until after a falling edge on the slow clock.

The exact ratio for switching between the two mechanisms isn't a precise requirement as long as its not set at too low a ratio. The ratio 1:4 is used in preferred embodiments because divide-by-four is trivial and requires no extra gates (we simply shift the data right by 2 bits).

Note also that the simpler logic of FIGS. 6 and 7 can actually handle large ratios—and in fact quite a few ratios that don't immediately match the half/integer ratio rule stated. For both sets of circuits, generating a list of all the ratios that work is rather involved and very dependent upon the qualities of the silicon process used to build the logic. Essentially, the faster the logic can run and the better the physical layout (so there are tighter timing tolerances) the more ratios can be supported by a given method of generating the sync signals.

Figure 11:
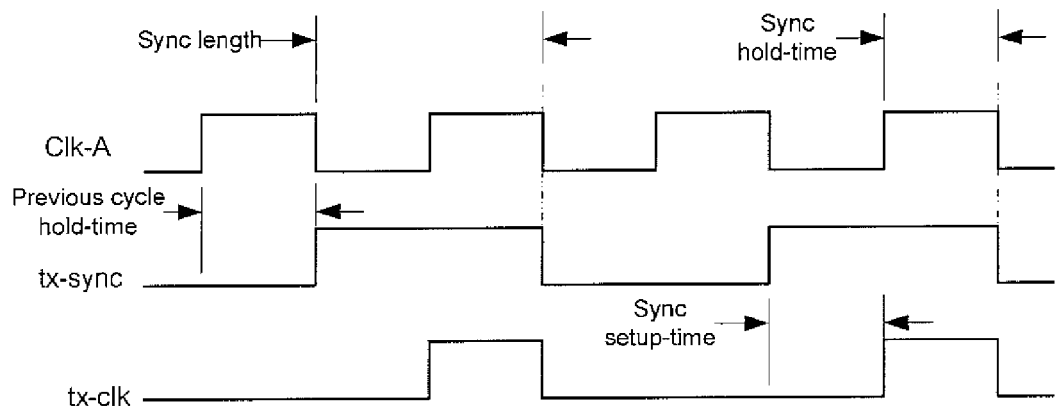
FIG. 11 is a timing diagram of set-up and hold times.
Figure 12:
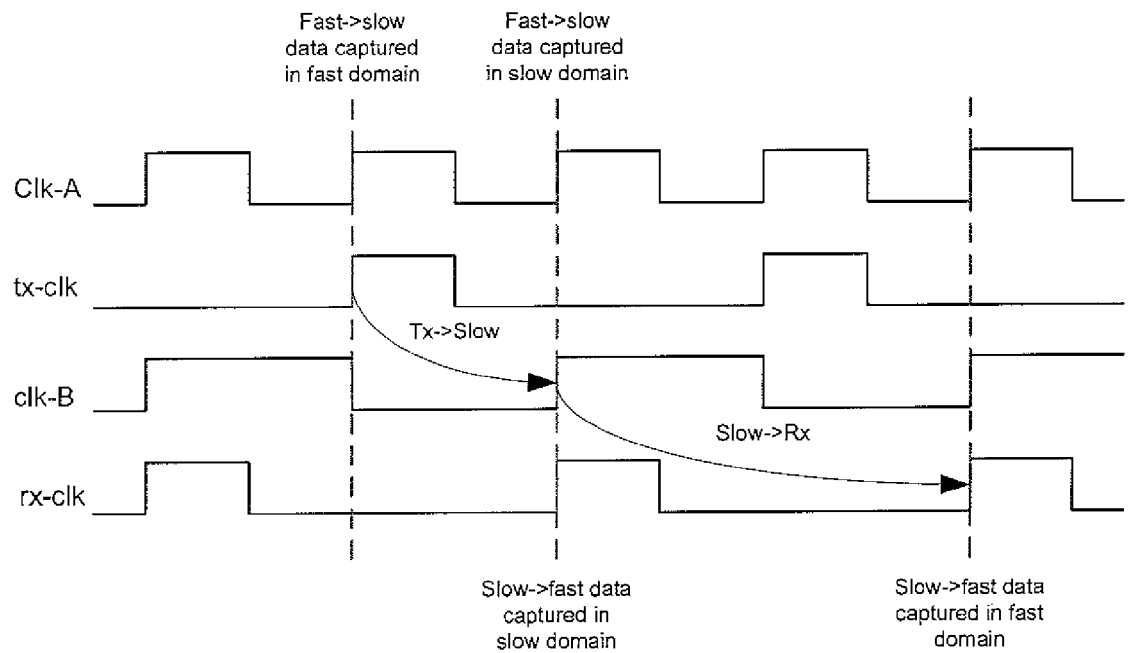
FIG. 12 is a timing diagram of domain handovers.

Note that to allow the logic to be built from real (non-ideal) logic gates, it is preferable that:
the time from a rising edge of the transmit clock signal (tx-clk) to the next rising edge of the second (slower) clock signal clk-B is maximised,
the time from a rising edge of the second (slower) clock signal clk-B to the next rising edge of the receive clock signal (rx-clk) is maximised, and
the set-up and hold times This preferred timing is illustrated in the timing diagrams of FIGS. 11 and 12.

In a preferred application, the first circuit portion A in the faster domain comprises a processor and the second circuit portion B in the slower domain comprises one or more peripherals or peripheral interfaces, preferably on the same chip. In this case, the first and second divider control signals (fast domain divider ctrl and slow domain divider ctrl) are preferably generated by software executed on the processor, thus allowing software control of the frequencies of the two domains. Peripherals typically operate at a much lower frequency than a processor, perhaps an order of magnitude lower.

It will be appreciated that the above embodiments are described only by way of example. In other embodiments for example, one or more additional dividers 6 and synchronisation generators 10 could be provided in order to scale to multiple clock domain boundary crossings. Further, an additional gearbox with connections to domains A and B swapped around could be provided to allow for the possibility that the second clock frequency could be greater (faster) than the first clock frequency. Further, the transmit and receive clock gate cells 12 and 16 may be replaced by re-circulating multiplexers. Further, the data transferred may be any kind of information, control data or otherwise. The invention may be used in applications other than a soft modem and other than a processor and its peripherals. Other variations and uses of the present invention may be apparent to a person skilled in the art given the disclosure herein. The scope of the invention is not limited by the described embodiments, but only by the following claims.

The invention claimed is:

1. A circuit comprising:
   clock circuitry comprising clock generating means arranged to supply a first clock signal having a first faster frequency to a first circuit portion and a second clock signal having a second slower frequency to a second circuit portion, the clock generating means being operable to vary the relative frequency of the first and second clock signals;
   synchronisation logic arranged to generate pulses based on the first and second clock signals, each pulse indicating when to transfer data between the first circuit portion and the second circuit portion;
   gating means arranged to produce a gated clock signal by gating the first clock signal, the gating means being open when said pulses are asserted; and
   transfer means arranged to clock data between the first circuit portion and the second circuit portion when clocked by the gated clock signal;
   wherein the clock circuitry comprises control logic configured to generate a first control signal at a predetermined time in each cycle of the first clock signal prior to a predetermined edge of the first clock signal, and to generate a second control signal at a predetermined time in each cycle of the second clock signal prior to a predetermined edge of the second clock signal, the clock generating means being configured such that a change in said relative frequency is conditional on a coincidence of the first and second control signals; and
   the synchronisation logic is configured to generate said pulses such that there is at least one cycle of the first clock signal between said pulses, and such that there is only one of said pulses per cycle of the second clock signal.

2. The circuit according to claim 1, wherein the clock generating means comprises:
   a first clock divider operable to generate the first clock signal by dividing a source clock signal by a first variable factor; and
   a second clock divider operable to generate the second clock signal by dividing the source clock signal by a second variable factor;
   wherein each of the first and second clock dividers is configured such that a change in the respective first and second factors is conditional on a coincidence of the first and second control signals.

3. The circuit according to claim 1 or 2, wherein the synchronisation logic comprises a chain of at least two flip-flops arranged to shift through the second clock signal when clocked by the first clock signal, and combinational logic arranged to generate said pulses in dependence on a combination of outputs from each of said flip-flops.

4. The circuit according to claim 3, wherein:
   the clock generating means is operable to select between a plurality of predetermined ratios between the first and second clock frequencies; and
   the combinational logic is arranged to receive a ratio indication signal indicative of the ratio between the first and second frequencies, and to generate said pulses using said ratio indication signal such that there is at least one cycle of the first clock signal between said pulses and only one of said pulses per cycle of the second clock signal regardless of the selected ratio.

5. The circuit according to claim 4, wherein at least one of said predetermined ratios is less than four and at least one of said predetermined ratios is greater than or equal to four; and
the ratio indication signal is indicative of whether or not the first frequency is greater than or equal to four times the second clock frequency.

6. The circuit according to claim 1, wherein the first circuit comprises a buffer arranged to buffer data to be transferred to the second circuit.

7. The circuit according to claim 1, wherein:
the synchronisation logic is arranged to generate transmit pulses which indicate when to transmit data from the first circuit portion to the second circuit portion and receive pulses which indicate when to receive data from the second circuit portion into the first circuit portion;
the gating means comprises transmit gating means arranged to produce a transmit clock signal by gating the first clock signal, the transmit gating means being open when said transmit pulses are asserted, and receive gating means arranged to produce a receive clock signal by gating the first clock signal, the receive gating means being open when said receive pulses are asserted;
the transfer means is arranged to transmit data from the first circuit portion to the second circuit portion when clocked by the transmit clock signal, and to receive data from the second circuit portion into the first circuit portion when clocked by the receive clock signal; and
the synchronisation logic is configured to generate said transmit pulses based on the first and second clock signals such that there is at least one cycle of the first clock signal between said transmit pulses and only one transmit pulse per cycle of the second clock signal, and to generate said receive pulses based on the first and second clock signals such that there is at least one cycle of the first clock signal between said receive pulses and only one receive pulse per cycle of the second clock signal.

8. The circuit according to claim 7, wherein the synchronisation logic is configured to generate the receive pulses out of phase with the transmit pulses.

9. The circuit according to claim 1, wherein the first circuit portion comprises a processor and the second circuit portion comprises at least one peripheral device.

10. The circuit according to claim 1, wherein the circuit is an integrated circuit.

11. A method comprising:
supplying a first clock signal having a first faster frequency to a first circuit portion;
supplying a second clock signal having a second slower frequency to a second circuit portion;
generating a first control signal at a predetermined time in each cycle of the first clock signal prior to a predetermined edge of the first clock signal;
generating a second control signal at a predetermined time in each cycle of the second clock signal prior to a predetermined edge of the second clock signal;
varying the relative frequency of the first and second clock signals on the condition of detecting a coincidence of the first and second control signals;
generating pulses based on the first and second clock signals to indicate when to transfer data between the first circuit portion and the second circuit portion, such that there is at least one cycle of the first clock signal between said pulses, and such that there is only one pulse per cycle of the second clock signal;
producing a gated clock signal by gating the first clock signal so as to pass it when said pulses are asserted; and
transferring data between the first circuit portion and the second circuit portion, the transfer being clocked by the gated clock signal.

12. The method of claim 11, comprising:
generating the first clock signal by dividing a source clock signal by a first variable factor; and
generating the second clock signal by dividing the source clock signal by a second variable factor;
wherein the generating of the first and second clock signals is performed such that a change in the respective first and second factors is conditional on a coincidence of the first and second control signals.

13. The method of claim 11 or 12, the generating of said pulses comprises shifting the second clock signal through a chain of at least two flip-flops when clocked by the first clock signal, and generating said pulses in dependence on a combination of outputs from each of said flip-flops.

14. The method of claim 13, wherein:
the generating of the clock signals comprises selecting between a plurality of predetermined ratios between the first and second clock frequencies; and
the generating of said pulses comprises using a ratio indication signal indicative of the ratio between the first and second frequencies, such that there is at least one cycle of the first clock signal between said pulses and only one of said pulses per cycle of the second clock signal regardless of the selected ratio.

15. The method of claim 14, wherein at least one of said predetermined ratios is less than four and at least one of said predetermined ratios is greater than or equal to four; and
the ratio indication signal is indicative of whether or not the first frequency is greater than or equal to four times the second clock frequency.

16. The method of claim 11, comprising buffering data to be transferred to the second circuit.

17. The method of claim 11, wherein:
the generating of said pulses comprises generating transmit pulses which indicate when to transmit data from the first circuit portion to the second circuit portion and receive pulses which indicate when to receive data from the second circuit portion into the first circuit portion
said gating comprises producing a transmit clock signal by gating the first clock signal so as to pass it when said transmit pulses are asserted, and producing a receive clock signal by gating the first clock signal so as to pass it when said receive pulses are asserted;
said transferring comprises transmitting data from the first circuit portion to the second circuit portion, the transmission being clocked by the transmit clock signal, and receiving data from the second circuit portion into the first circuit portion, the reception being clocked by the receive clock signal; and
the generating of said pulses comprises generating said transmit pulses based on the first and second clock signals such that there is at least one cycle of the first clock signal between said transmit pulses and only one of said transmit pulses per cycle of the second clock signal, and to generate said receive pulses based on the first and second clock signals such that there is at least one cycle of the first clock signal between said receive pulses and only one of said receive pulses per cycle of the second clock signal.

18. The method of claim 17, wherein the receive pulses are generated out of phase with the transmit pulses.

19. The method of claim 11, wherein the first circuit portion comprises a processor and the second circuit portion comprises at least one peripheral device.

20. The method of claim 11, wherein the circuit is an integrated circuit.

21. A circuit comprising:
clock circuitry comprising clock generating means arranged to supply a first clock signal having a first faster frequency to a first circuit portion and a second clock signal having a second slower frequency to a second circuit portion, the clock generating means being operable to select between a plurality of predetermined ratios between the first and second clock frequencies;
synchronisation logic for generating pulses based on the first and second clock signals, each pulse indicating when to transfer data between the first circuit portion and the second circuit portion;
gating means arranged to produce a gated clock signal by gating the first clock signal, the gating means being open when said pulses are asserted; and
transfer means arranged to transfer data between the first circuit portion and the second circuit portion when clocked by the gated clock signal;
wherein the synchronisation logic comprises a chain of at least two flip-flops arranged to shift through the second clock signal when clocked by the first clock signal, and combinational logic arranged to generate said pulses in dependence on a combination of outputs from each of said flip-flops; and
the combinational logic is arranged to receive a ratio indication signal indicative of the ratio between the first and second frequencies, and to generate said pulses using said ratio indication signal such that regardless of the selected ratio: there is at least one cycle of the first clock signal between said pulses, and there is only one of said pulses per cycle of the second clock signal.

22. The circuit according to claim 21, wherein at least one of said predetermined ratios is less than four and at least one of said predetermined ratios is greater than or equal to four; and
the ratio indication signal is indicative of whether or not the first frequency is greater than or equal to four times the second clock frequency.

23. The circuit according to claim 21 or 22, wherein the clock circuitry comprises control logic configured to generate a first control signal at a predetermined time in each cycle of the first clock signal prior to a predetermined edge of the first clock signal, and to generate a second control signal at a predetermined time in each cycle of the second clock signal prior to a predetermined edge of the second clock signal, the clock generating means being configured such that a change in said ratio is conditional on a coincidence of the first and second control signals.

24. The circuit according to claim 21, wherein the clock generating means comprises:
a first clock divider operable to generate the first clock signal by dividing a source clock signal by a first variable factor; and
a second clock divider operable to generate the second clock signal by dividing the source clock signal by a second variable factor.

25. The circuit according to claim 23, wherein each of the first and second clock dividers is configured such that a change in the respective first and second factors is conditional on a coincidence of the first and second control signals.

26. The circuit according to claim 21, wherein the first circuit comprises a buffer arranged to buffer data to be transferred to the second circuit.

27. The circuit according to claim 21, wherein:
the synchronisation logic is arranged to generate transmit pulses which indicate when to transmit data from the first circuit portion to the second circuit portion and receive pulses which indicate when to receive data from the second circuit portion into the first circuit portion;
the gating means comprises transmit gating means arranged to produce a transmit clock signal by gating the first clock signal, the transmit gating means being open when said transmit pulses are asserted, and receive gating means arranged to produce a receive clock signal by gating the first clock signal, the receive gating means being open when said receive pulses are asserted;
the transfer means is arranged to transmit data from the first circuit portion to the second circuit portion when clocked by the transmit clock signal, and to receive data from the second circuit portion into the first circuit portion when clocked by the receive clock signal; and
the synchronisation logic is configured to generate said transmit pulses based on the first and second clock signals such that regardless of the selected ratio there is at least one cycle of the first clock signal between said transmit pulses and only one transmit pulse per cycle of the second clock signal, and to generate said receive pulses based on the first and second clock signals such that regardless of the selected ratio there is at least one cycle of the first clock signal between said receive pulses and only one receive pulse per cycle of the second clock signal.

28. The circuit according to claim 27, wherein the synchronisation logic is configured to generate the receive pulses out of phase with the transmit pulses.

29. The circuit according to claim 21, wherein the first circuit portion comprises a processor and the second circuit portion comprises at least one peripheral device.

30. The circuit according to claim 21, wherein the circuit is an integrated circuit.

31. A method comprising:
supplying a first clock signal having a first faster frequency to a first circuit portion;
supplying a second clock signal having a second slower frequency to a 20 second circuit portion;
selecting the relative frequency between the first and second clock signals from a plurality of predetermined ratios;
shifting the second clock signal through a chain of at least two flip-flops, the shifting being clocked by the first clock signal;
receiving a ratio indication signal indicative of the ratio between the first and second frequencies;
generating pulses which indicate when to transfer data between the first circuit portion and the second circuit portion, by using a combination of outputs from each of said flip-flops and said ratio indication signal such that, regardless of the selected ratio, there is at least one cycle of the first clock signal between said pulses, and there is only one pulse per cycle of the second clock signal;
producing a gated clock signal by gating the first clock signal so as to pass it when the pulses are asserted; and
transferring data between the first circuit portion and the second circuit portion, the transfer being clocked by gated clock signal.

32. The method of claim 31, wherein at least one of said predetermined ratios is less than four and at least one of said predetermined ratios is greater than or equal to four; and the ratio indication signal is indicative of whether or not the first frequency is greater than or equal to four times the second clock frequency.

33. The method of claim 31 or 12, comprising:
generating a first control signal at a predetermined time in each cycle of the first clock signal prior to a predetermined edge of the first clock signal; and
generating a second control signal at a predetermined time in each cycle of the second clock signal prior to a predetermined edge of the second clock signal,
generating the first and second clock signals such that a change in said ratio is conditional on a coincidence of the first and second control signals.

34. The method according to claim 31, comprising:
generating the first clock signal by dividing a source clock signal by a first variable factor; and
generating the second clock signal by dividing the source clock signal by a 25 second variable factor.

35. The method according to claim 33, wherein a change in the respective first and second factors is conditional on a coincidence of the first and second control signals.

36. The method according to claim 31, comprising buffering data to be transferred to the second circuit.

37. The method of claim 31, wherein:
the generating of said pulses comprises generating transmit pulses which indicate when to transmit data from the first circuit portion to the second circuit portion and receive pulses which indicate when to receive data from the second circuit portion into the first circuit portion
said gating comprises producing a transmit clock signal by gating the first clock signal so as to pass it when said transmit pulses are asserted, and producing a receive clock signal by gating the first clock signal so as to pass it when said receive pulses are asserted;
said transferring comprises transmitting data from the first circuit portion to the second circuit portion, the transmission being clocked by the transmit clock signal, and receiving data from the second circuit portion into the first circuit portion, the reception being clocked by the receive clock signal; and
the generating of said pulses comprises generating said transmit pulses based on the first and second clock signals such that regardless of the selected ratio there is at least one cycle of the first clock signal between said transmit pulses and only one of said transmit pulses per cycle of the second clock signal, and to generate said receive pulses based on the first and second clock signals such that regardless of the selected ratio there is at least one cycle of the first clock signal between said receive pulses and only one of said receive pulses per cycle of the second clock signal.

38. The method of claim 37, wherein the receive pulses are generated out of phase with the transmit pulses.

39. The method of claim 31, wherein the first circuit portion 30 comprises a processor and the second circuit portion comprises at least one peripheral device.

40. The method of claim 31, wherein the circuit is an integrated circuit.

* * * * *